(12) United States Patent
Kunkel

(10) Patent No.: US 6,448,739 B1
(45) Date of Patent: Sep. 10, 2002

(54) SANITARY INSTALLATION

(75) Inventor: Horst Kunkel, Stuttgart (DE)

(73) Assignee: Hansa Metallwerke AG, Stuttgart (DE)

( * ) Notice: Subject to any disclaimer, the term of this patent is extended or adjusted under 35 U.S.C. 154(b) by 0 days.

(21) Appl. No.: 09/899,770

(22) Filed: Jul. 5, 2001

(30) Foreign Application Priority Data

Jul. 4, 2001 (DE) .......................... 100 32 463

(51) Int. Cl.[7] .............................................. H02J 7/35
(52) U.S. Cl. ...................................... 320/101; 320/107
(58) Field of Search .............................. 320/101, 107; 251/129.01, 129.02, 129.04; 429/96, 97, 98, 99, 100

(56) References Cited

U.S. PATENT DOCUMENTS

| | | | | |
|---|---|---|---|---|
| 5,079,495 A | * | 1/1992 | Yasuo | 320/101 |
| 5,106,495 A | * | 4/1992 | Hughes | 210/139 |
| 5,994,641 A | * | 11/1999 | Kardauskas | 136/246 |

FOREIGN PATENT DOCUMENTS

| | | |
|---|---|---|
| DE | 42 18 658 A1 | 12/1992 |
| DE | 43 04 345 C2 | 4/1997 |

OTHER PUBLICATIONS

Siemens Prospectus entitled, "Kleinspeicher mit beruhrungsloser Armatur! Die saubere Losung von Siemens fur mehr Komfor und Hygiene," 1991, Germany.

* cited by examiner

Primary Examiner—Edward H. Tso
Assistant Examiner—Lawrence Luk
(74) Attorney, Agent, or Firm—Factor & Partners, LLC

(57) ABSTRACT

A sanitary installation (1) has a sanitary fitting (2) with an electrically actuable device, in particular a solenoid valve. Furthermore, it comprises a rechargeable battery (3) fed by a solar cell device (6) which is part of a supply device. The solar cell device (6) is integrated in a mirror (7) situated in the vicinity of the sanitary fitting (2). Ambient light which is regularly present during the operation of the sanitary appliance suffices for the self-sufficient operation of the sanitary installation (1).

5 Claims, 2 Drawing Sheets

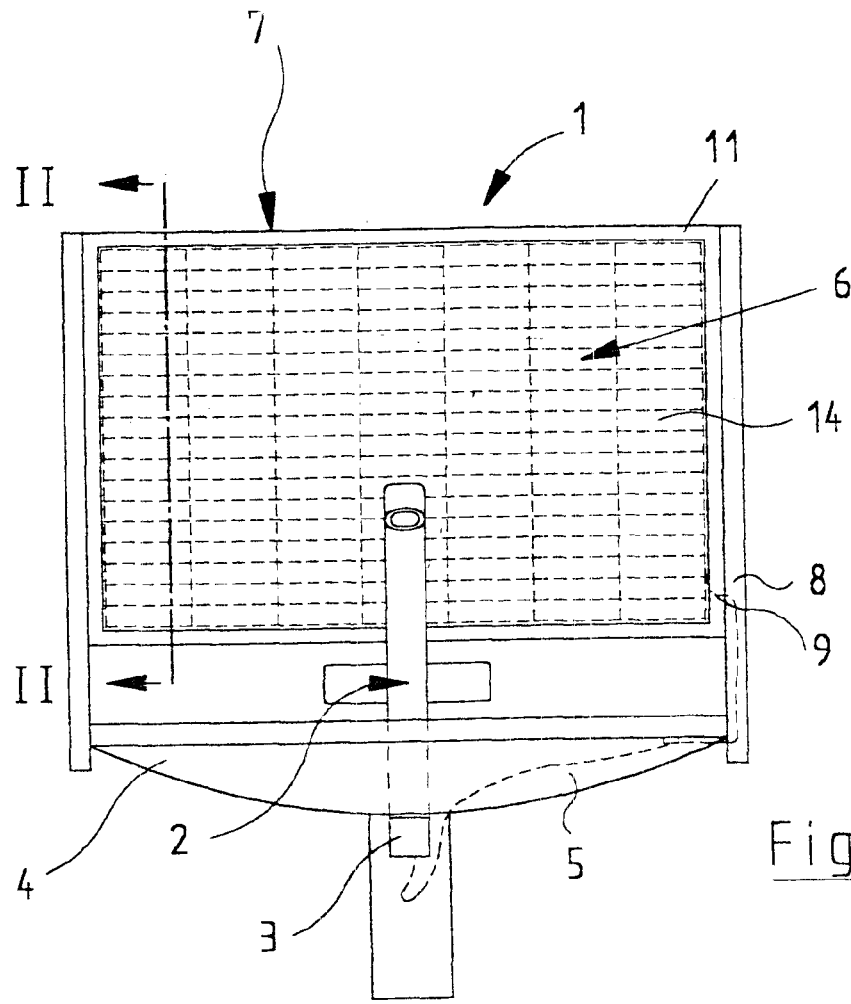
Fig. 1
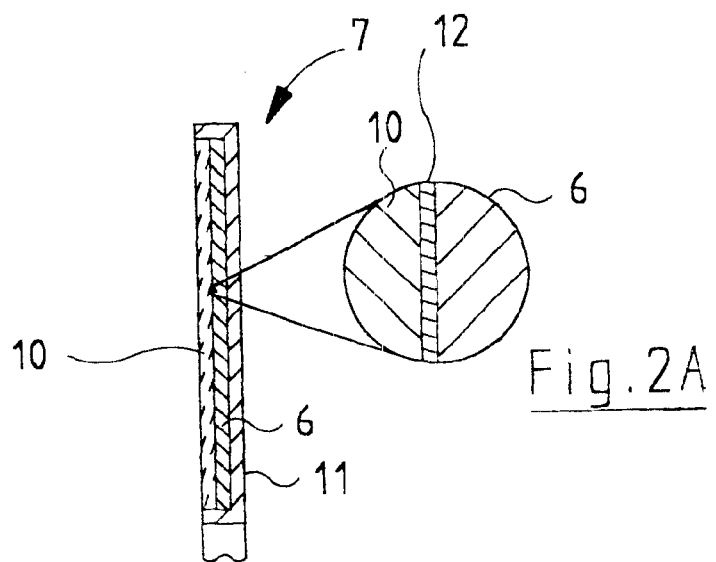
Fig. 2A
Fig. 2

SANITARY INSTALLATION

The invention relates to a sanitary installation with a sanitary fitting, at least one electrically actuable device, in particular a solenoid valve, a rechargeable battery, a supply device, comprising a solar cell device, for the battery, and a mirror situated in the vicinity of the sanitary fitting.

In known sanitary installations of this type, the solar cell device is accommodated on the housing of the sanitary fitting. At this location, the solar cell device is unsuitable for reliable operation of a solenoid valve for example, since only a very small supply current is delivered in order to charge the battery and therefore the energy stored in the battery is very limited.

Known sanitary installations of this type still have to be connected therefore to a domestic supply network. This requires the presence of an appropriate network connection in the sanitary area, which is not always guaranteed. Moreover, energy costs are incurred during the operation of a known sanitary fitting of this type.

It is therefore the object of the present invention to develop a sanitary installation of the type mentioned at the outset in such a way that reliable operation is guaranteed independently of the domestic supply network.

This object is achieved according to the invention in that the solar cell device is integrated into the mirror.

The invention makes use of the fact that in a room having a mirror it is always necessary for there to be a light source (daylight and/or artificial light) present as well. A small part of the light emitted by this light source in the direction of the mirror is used by means of the solar cell device to operate the sanitary fitting and/or to charge the battery.

The battery, charged by a solar cell device designed in this way, provides sufficient energy for the actuation of the sanitary installation in normal use. The size of the active area of the solar cell device ensures that the battery is recharged. Normal ambient light suffices for this. Daylight or direct incidence of sunlight are not necessary; because of the large usable area for the solar cell device and the generally low energy requirement of the sanitary fitting, artificial illumination of the sanitary area is also sufficient for example.

This is not the case with other designs for charging the battery, for example by utilising the water flow in the sanitary fitting: when the battery is fully discharged, it is no longer possible to use a known sanitary fitting of this type with an electrical supply based on the water flow, since even the energy for opening the solenoid valve is not available.

A battery-charging device which, via Peltier elements, utilises the temperature of the hot water to produce energy also has these disadvantages, since it is likewise dependent on the operation of the sanitary fitting.

The mirror can comprise a frame housing, the solar cell device being integrated into the frame housing. In a design of this type, a fully reflecting commercially available mirror surface can be employed.

Alternatively, the mirror can comprise a partially reflecting coating, the solar cell device being arranged behind the partially reflecting coating. Partially reflecting mirrors of this type are easy to produce. Thus, frameless mirror designs are also possible. Since mirrors generally occupy a relatively large area, only a relatively small part of the light striking the mirror surface needs to be transmitted to obtain energy by means of the solar cell device. The majority of the light striking the mirror surface is therefore available as reflected light.

Preferably, a supply line, which connects the battery to the sanitary fitting, is run in a frame housing, which connects the mirror to the sanitary fitting or to a washstand of the sanitary fitting. This permits in a simple way a visually attractive design of the sanitary installation without obtrusive visible cables.

The solar cell device can have a plurality of solar cell modules. Solar cell module is understood in this context to mean a standard assembly with one solar cell or a plurality of solar cells. The solar cell modules are designed in such a way that they can be electrically connected to one another in a series of different relative positions. In this way, a solar cell device of any desired size and shape can be constructed. When using solar cell modules of this type, different mirrors and/or frame sizes can therefore be fitted with the solar cell device.

Exemplary embodiments of the invention are described below with reference to the drawing, in which:

FIG. 1 shows a sanitary installation with an electrically operated sanitary fitting and a solar cell module fitted in a mirror;

FIG. 2 shows a section along the line II—II in FIG. 1;

FIG. 2A shows an enlarged view of the section shown in FIG. 2;

Figure 3:
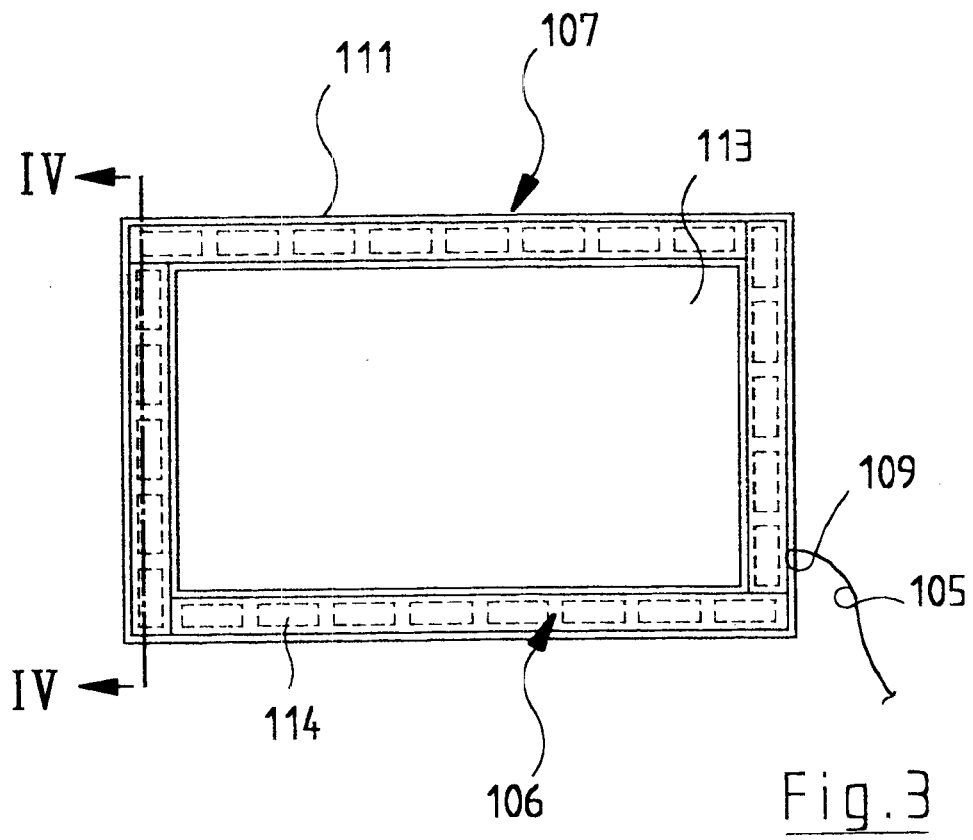
FIG. 3 shows a mirror of an alternative sanitary appliance, in which four solar cell modules are accommodated in the frame housing.

A sanitary installation, denoted in FIG. 1 as a whole by the reference symbol 1, comprises a sanitary fitting 2 which is controlled in a contactless manner. For the electrical supply, for example, of a proximity sensor (not shown) of the sanitary fitting 2 and of solenoid valves which control the water flow, use is made of a rechargeable battery 3 accommodated in the housing of the said fitting. The sanitary fitting 2 is borne by a washstand 4.

To charge the battery 3, it has an electrical supply line 5, which is shown in broken lines since it is not visible in the view of FIG. 1. The supply line 5 connects the battery 3 to a solar cell module 6 accommodated in a mirror 7 belonging to the sanitary installation 1.

Starting from the battery 3, the supply line 5 is run first behind the washstand 4 and then in a frame housing 8 of the mirror 7. The frame housing 8 extends on both sides of the rectangular mirror 7 and comes to bear on lateral end faces of the washstand 4. In this region, the supply line 5 is led from outside, without being visible, into the interior of the section of the frame housing 8 on the right in FIG. 1 and runs in the said frame housing up to an electrical connection 9, which connects the supply line 5 to the solar cell module 6.

The solar cell module 6 consists of a multiplicity of solar cells, which are indicated by broken-line rectangles in FIG. 1 and are electrically interconnected.

The construction of the mirror 7 is shown clearly by the sectional representation of FIG. 2:

A rectangular glass pane 10 with a partially reflecting coating on the rear side is set in a frame housing 11. The partially reflecting coating is formed by a vapour-deposited metal coating 12, shown diagrammatically in the enlarged detail of FIG. 2. Also set in the frame housing 11 is the solar cell module 6, which is arranged behind the glass pane 10 and the metal coating borne by the latter.

The sanitary installation 1 works as follows:

The electrical energy required to actuate the sanitary fitting 2 is provided by the battery 3. The latter is recharged via the solar cell module 6 and the supply line 5. This takes place whenever utilisable light, i.e. either daylight or light from artificial illumination, strikes the mirror 7. This light is only partially reflected by the metal coating 12 of the glass pane 10. The remaining portion is transmitted by the metal coating 12 and thus passes to the solar cell module 6, in which it is converted into electrical energy. When the mirror 7 is illuminated, electrical energy is thus available and can be utilised to operate the sanitary fitting 2.

Instead of a metal coating 12 on the rear side, it is also possible, as an alternative, for a partially reflecting coating to be present on the front side of the glass pane 10. In a further variant, the glass pane 10 can be completely omitted and the metal coating 12 can be applied directly to the solar cell module 6.

Figure 4:
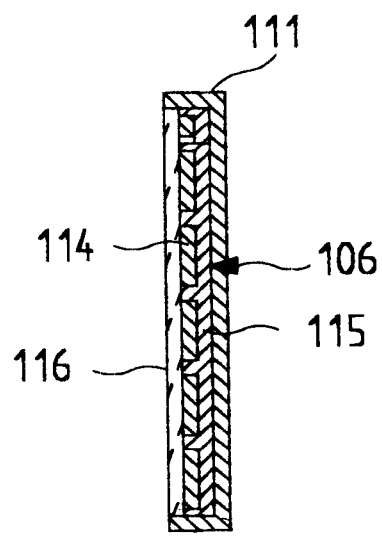
FIG. 4 shows a section along the line IV—IV in FIG. 3.

An alternative embodiment of a sanitary installation is illustrated in FIGS. 3 and 4. Components corresponding to those which have been described in connection with FIGS. 1 and 2 bear reference symbols increased by 100 and are not explained in detail again.

The mirror 107 of the alternative sanitary installation of FIGS. 3 and 4 has a central, fully metal-coated mirror surface 113 surrounded by a rectangular frame housing 111. In this embodiment, four solar cell modules 106 are set in the frame housing 111. The two solar cell modules 106 set in the long sides of the frame housing 111 each have eight solar cells 114, shown as broken-line rectangles, and the solar cell modules 106 accommodated in the narrow sides of the mirror housing 111 each have five thereof. The solar cells 114 of the solar cell modules 106 are electrically connected to one another in a manner not shown. The four solar cell modules 106 are electrically connected to one another by electrical plug connections, not shown in detail.

FIG. 4 shows that the solar cells 114 are set in a module housing 115, which is set in the frame housing 111 and has a glass covering pane 116 which covers the active areas of the solar cell units 114. The covering pane 116 has no metal coating.

The solar cell modules 106 are connected to a supply line 105 via a connection 109.

Apart from the mirror 107, the construction of the sanitary installation of FIGS. 3 and 4 corresponds to that illustrated in FIGS. 1 and 2.

In the sanitary installation according to FIGS. 3 and 4, the light which strikes the frame housing 111 surrounding the mirror surface 113 is utilised for conversion into electrical energy. This electrical energy generated in the solar cell modules 106 is passed on to the battery of the sanitary fitting via the supply line 105.

What is claimed is:

1. Sanitary installation with a sanitary fitting, at least one electrically actuable device, in particular a solenoid valve, a rechargeable battery, a supply device, comprising a solar cell device, for the battery, and a mirror situated in the vicinity of the sanitary fitting, characterized in that the solar cell device is integrated into the mirror.

2. Sanitary installation according to claim 1, characterised in that the mirror comprises a frame housing, the solar cell device being integrated in the frame housing.

3. Sanitary installation according to claim 1, characterised in that the mirror comprises a partially reflecting coating, the solar cell device being arranged behind the partially reflecting coating.

4. Sanitary installation according to claim 1, characterised in that a supply line, which connects the battery to the sanitary fitting, is run in a frame housing, which connects the mirror to the sanitary fitting or to a washstand of the sanitary fitting.

5. Sanitary installation according to claim 1, characterised in that the solar cell device has a plurality of solar cell modules.

* * * * *